United States Patent
Analytis et al.

(10) Patent No.: US 11,342,500 B2
(45) Date of Patent: May 24, 2022

(54) ANTIFERROMAGNETIC MEMORY STORAGE DEVICES FROM MAGNETIC TRANSITION METAL DICHALCOGENIDES

(71) Applicants: James G. Analytis, San Francisco, CA (US); Eran Maniv, Berkeley, CA (US); Nityan L. Nair, Berkeley, CA (US); Spencer Doyle, San Luis Obispo, CA (US); Caolan John, Altadena, CA (US)

(72) Inventors: James G. Analytis, San Francisco, CA (US); Eran Maniv, Berkeley, CA (US); Nityan L. Nair, Berkeley, CA (US); Spencer Doyle, San Luis Obispo, CA (US); Caolan John, Altadena, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 16/938,089

(22) Filed: Jul. 24, 2020

(65) Prior Publication Data

US 2021/0028359 A1    Jan. 28, 2021

Related U.S. Application Data

(60) Provisional application No. 62/878,438, filed on Jul. 25, 2019.

(51) Int. Cl.
*H01L 45/00* (2006.01)
*G11C 11/16* (2006.01)
(Continued)

(52) U.S. Cl.
CPC ........ *H01L 45/141* (2013.01); *G11C 11/1673* (2013.01); *G11C 13/0004* (2013.01);
(Continued)

(58) Field of Classification Search
CPC ... H01L 45/141; H01L 45/1253; H01L 43/02; H01L 43/10; H01L 43/08;
(Continued)

(56) References Cited

U.S. PATENT DOCUMENTS

2015/0355098 A1* 12/2015 Hsieh .................... G01N 21/636
                                                              250/224
2018/0106873 A1*  4/2018 Wu ....................... G01R 33/093
(Continued)

FOREIGN PATENT DOCUMENTS

EP   3001470 B1   9/2017
EP   3474281 A1   4/2019

OTHER PUBLICATIONS

Wadley, P. et al., "Electrical switching of an antiferromagnet", Science, vol. 351, issue 6273, pp. 587-590, Feb. 5, 2016, published online Jan. 14, 2016.
(Continued)

*Primary Examiner* — Tri M Hoang
(74) *Attorney, Agent, or Firm* — O'Banion & Ritchey LLP; John P. O'Banion

(57) ABSTRACT

Switchable antiferromagnetic (AFM) memory devices are provided based on magnetically intercalated transition metal dichalcogenides (TMDs) of the form $A_xMC_2$, where A is a magnetic element of stoichiometry x between 0 and 1, M is a transition metal of stoichiometry 1, and C is a chalcogen of stoichiometry 2. Memory storage is achieved by fabricating these materials into crosses of two or more bars and driving DC current pulses along the bars to rotate the AFM order to a fixed angle with respect to the current pulse. Application of current pulses along different bars can switch the AFM order between multiple directions. Standard resistance measurements can detect the orientation of the AFM order as high or low resistance states. The state of the device can be set by the input current pulses, and read-out by the
(Continued)

resistance measurement, forming a non-volatile, AFM memory storage bit.

20 Claims, 11 Drawing Sheets

(51) Int. Cl.
- G11C 13/00 (2006.01)
- H01L 43/10 (2006.01)
- H01L 43/08 (2006.01)
- H01L 43/02 (2006.01)

(52) U.S. Cl.
CPC .............. *H01L 43/02* (2013.01); *H01L 43/08* (2013.01); *H01L 43/10* (2013.01); *H01L 45/1253* (2013.01)

(58) Field of Classification Search
CPC ............ G11C 11/1673; G11C 13/0004; G11C 11/1675; G11C 11/161
See application file for complete search history.

(56) References Cited

U.S. PATENT DOCUMENTS

| | | | |
|---|---|---|---|
| 2020/0020850 A1* | 1/2020 | Dorrance | H01L 43/02 |
| 2020/0161535 A1* | 5/2020 | Lin | G11C 11/1675 |
| 2020/0264248 A1* | 8/2020 | Xu | H01L 43/08 |

OTHER PUBLICATIONS

Bodna, S. Yu et al., "Writing and reading antiferromagnetic Mn2Au by Neel spin-orbit torques and large anistropic magnetoresistance", Nature Communications, (2018) 9:348, published online Jan. 24, 2018.

Nair, Nityan L. et al., "Electrical switching in a magnetically intercaled transition metal dichalcogenide", Nature Materials, vol. 19, Feb. 2020, p. 153-157, published online Nov. 4, 2019.

Van Laar, B., et al., "Magnetic and Crystallographic Structures of MexNbS2 and MexTaS2", Journal of Solid State Chemistry 3, 154-160 (1971).

Gorochov, O. et al., "Transport properties, magnetic susceptibility and Mossbauer spectroscopy of Fe 0.25 NbS and Fe 0.33 NbS2", Philosophical. Magazine B, vol. 43, No. 4, pp. 621-634 (1981), DOI: 10.1080/01418638108222164, published online Aug. 20, 2006.

Manzeli, S. et al., "2D transition and dichalcogenides", Nature Reviews Materials, vol. 2, Article 17033, pp. 1-15 (2017), published online Jun. 13, 2017.

Chhowalla, M. et al., "The chemistry of two-dimensional layered transition metal dischalcogenide nanoheets", Nature Chemistry, vol. 5, Apr. 2013, pp. 263-275, published online Mar. 20, 2013.

Friend, R. H. et al., "Electrical and magnetic properties of some first row transitiion metal intercaltes of niobium disulphide", Philosopical Magazine (1977), vol. 35, No. 5, pp. 1269-1287, DOI: 10.1080/14786437708232952, published online Sep. 13, 2006.

Parkin, S. S. P. et al., "3 d transition-metal intercalates of the niobium and tantalum dichalcogenides. I magnetic properties", Philosophical Magazine B (1980), vol. 41, No. 1, pp. 65-93, DOI: 10.1080/13642818008245370, published online Dec. 1, 2006.

* cited by examiner

ANTIFERROMAGNETIC MEMORY STORAGE DEVICES FROM MAGNETIC TRANSITION METAL DICHALCOGENIDES

CROSS-REFERENCE TO RELATED APPLICATIONS

This application claims priority to, and the benefit of, U.S. provisional patent application Ser. No. 62/878,438 filed on Jul. 25, 2019, incorporated herein by reference in its entirety.

STATEMENT REGARDING FEDERALLY SPONSORED RESEARCH OR DEVELOPMENT

This invention was made with government support under Contract No. DE-AC02-05CH11231 awarded by the U.S. Department of Energy. The government has certain rights in the invention.

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

This technology pertains generally to antiferromagnetic materials, systems and methods and more particularly to a devices and methods for electrical switching of magnetically intercalated transition metal dichalcogenides and a tunable class of switchable magnetic materials.

2. Background

Spintronics are a class of devices that are based on the spin of an electron rather than its charge. Ferromagnetism has been the primary approach to conventional non-volatile data storage and spintronic sensing devices. However ferromagnetic materials have the disadvantage of exhibiting ohmic losses during operation and unwanted interactions due to stray magnetic fields. For example, traditional spintronic magnetic memory that uses ferromagnetic materials to encode the 1's and 0's of the binary code may have the encoded information erased by exposure to strong magnetic fields.

The weaknesses found in ferromagnetic materials could be avoided with the use of antiferromagnetic materials for spintronic applications rather than ferromagnetic materials. Antiferromagnetic materials (AFM) are promising because they demonstrate a low susceptibility to external magnetic fields as well fast magnetic dynamics. Because antiferromagnets do not produce stray magnetic fields and are generally insensitive to disturbing magnetic fields, one antiferromagnetic element will not magnetically affect the surrounding elements regardless of the density or arrangement of the elements in a device.

Compared to the their widely used ferromagnetic counterparts, antiferromagnetic materials also possess ultrafast spin dynamics. For example, AFM devices have been demonstrated to switch at THz speeds, significantly faster than their GHz-limited ferromagnetic counterparts. Combined, these properties make antiferromagnetic materials appealing for high-density, ultrafast, extremely stable memory storage applications. The field insensitivity of these materials, however, makes manipulating and detecting AFMs difficult, limiting their widespread adoption.

There are only a handful of material systems with an AFM spin texture that can be electrically manipulated or 'switched'. The mechanism is generally explained with reference to the same underlying physics; an applied current induces a spin-polarization due to a combination of inversion asymmetry and spin-orbit coupling, that then transfers angular momentum into the system, exerting a 'spin-orbit torque' that is able to manipulate the magnetic domains of the ordered state. Technically, this is referred to as a rotation of the Néel vector, which defines the orientation of a domain. This in turn rotates the principal axes of the conductivity of the material, providing a switch between high and low resistance states along perpendicular directions. The 'high/low' contrast of the switching is determined not only by the efficacy with which angular momentum can be transferred to the magnetic lattice by the applied current, but also by the degree of conductivity anisotropy within a domain.

Accordingly, the ability to manipulate and read-out the Néel vector orientation is required for antiferromagnets to be used as active elements in spintronic devices. However, the active manipulation and read-out of the Néel vector orientation has proven to be challenging.

Advances in controlling the correlated behavior of transition metal dichalcogenides have opened a new frontier of many-body physics in two dimensions. A field where these materials have yet to make a deep impact is antiferromagnetic spintronics, that promises technologies with fast switching times, insensitivity to magnetic perturbations, and reduced crosstalk.

New tunable antiferromagnetic materials are needed that are capable of magnetic switching at low currents and low temperatures that are relatively impervious to stray magnetic fields.

BRIEF SUMMARY

The present technology provides a class of magnetically intercalated transition metal dichalcogenides (TMDs), that is diverse and has highly tunable electronic and magnetic properties and possesses switchable antiferromagnetic (AFM) orders. Also illustrated are antiferromagnetic (AFM) memory devices that are based on the magnetically intercalated transition metal dichalcogenide compounds of the form $A_xMC_2$, where A is a magnetic transition metal of stoichiometry x, where x ranges from 0 to 1, M is a transition metal of stoichiometry 1, and C is a chalcogen with a stoichiometry of 2.

The active materials are illustrated with $Fe_{1/3}NbS_2$, that consists of iron atoms intercalated in a periodic lattice between planes of the 2H phase of $NbS_2$. Other examples of antiferromagnetic intercalated TMDs with elevated transition temperatures include $Ni_xNbS_2$ and $Cr_xNbS_2$. Preliminary measurements show that $Cr_{1/3}NbS_2$ may exhibit switchable AFM memory at room temperature at similar current densities as $Fe_{1/3}NbS_2$.

Preferred magnetic transition metals (A) of the $A_xMC_2$ material composition includes iron (Fe), nickel (Ni), chromium (Cr), cobalt (Co), manganese (Mn) and vanadium (V). Preferred transition metals (M) of the $A_xMC_2$ material includes niobium (Nb), molybdenum (Mo), tantalum (Ta) and tungsten (W). Preferred chalcogens (C) of the material includes sulfur (S), selenium (Se), and tellurium (Te).

Magnetically intercalated TMD materials that exhibit AFM ordering can have ordering that is manipulated with DC electric current pulses and probes (or read-out) by simple (AC or DC) resistance measurements. In one simple embodiment, the device comprises a cross of the magnetically intercalated TMD material exhibiting AFM order. The two legs forming each bar of the cross may be used to apply orthogonal DC current pulses. Applying a sufficiently large DC current pulse along one bar of the device will rotate the AFM order to a fixed angle with respect to the current pulse through a spin transfer torque. Applying a DC pulse along the other leg, will do the same with respect to that pulse, resulting in a rotation of the AFM order by 90 degrees.

Consequently, the DC pulses applied along the orthogonal legs can be used to switch the AFM order back and forth between two orthogonal orientations. This process is accomplished through a spin transfer torque which couples the electric current density to the AFM moments and is allowed by the inversion symmetry breaking of the lattice.

The orientation of the AFM order can then be read out through a standard resistance measurement (AC or DC) along one of the legs of the crossed bars. Because of the intrinsic anisotropic magnetoresistance (AMR) in these materials, the resistance measurement will show a high or low value depending on the orientation of the AFM order.

In this manner, a DC current pulse can set the direction of the AFM order, which can then be read out as a high or low resistance state. Which pulse corresponds to high resistance or low resistance depends on the exact configuration of the resistance measurement. Likewise, the state of the device can be set by the input DC current pulses, and read-out by the resistance measurement, forming a non-volatile, AFM memory storage bit. The device in this embodiment is a two-level memory bit. Adding additional contacts allows the DC current pulse to be applied in additional directions thereby increasing the number of levels that the memory device is capable of storing to provide multi-level memory storage.

Although the AFM memory storage using this write-in/read-out scheme has been generally demonstrated, this is the first set of devices produced from magnetically intercalated TMDs of the form $A_xMC_2$. Compared to other materials previously used in these types of AFM memory devices such as CuMnAs and $Mn_2Au$, the current densities required to switch the memory bit for $Fe_{1/3}NbS_2$ is two orders of magnitude smaller resulting in lower power consumption per write operation. In addition, the high/low resistance response saturates with a single DC current pulse compared to tens to hundreds of pulses required in existing materials. This will also result in lower power consumption per write operation, faster write operations, and potentially simpler control electronics.

According to one aspect of the technology a class of magnetically intercalated transition metal dichalcogenides (TMDs) is provided of the form $A_xMC_2$, where A is a magnetic transition metal of stoichiometry x, where x ranges from 0 to 1, M is a transition metal stoichiometry 1, and C is a chalcogen with stoichiometry 2.

According to another aspect of the technology, an antiferromagnetic (AFM) memory device platform is provided based on the magnetically intercalated TMD compounds that can be adapted to produce faster, lower-power, non-volatile memory that existing devices.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWINGS

The technology described herein will be more fully understood by reference to the following drawings which are for illustrative purposes only.

DETAILED DESCRIPTION

Figure 1:
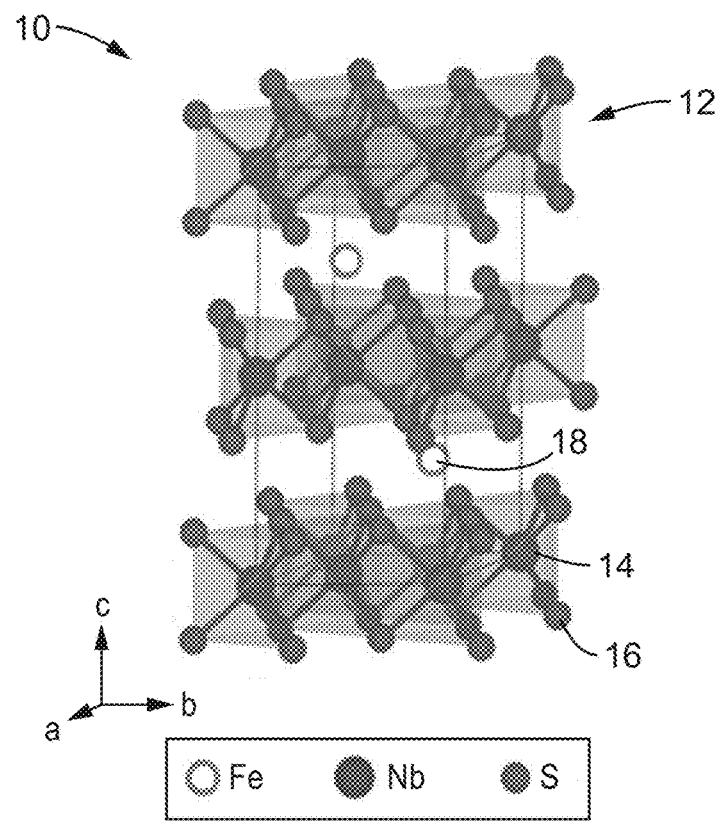
FIG. 1 is a schematic structure diagram of $Fe_{1/3}NbS_2$ depicting 2H—$NbS_2$ with iron atoms intercalated between layers according to one embodiment of the technology. At this stoichiometry, the iron intercalants form an ordered lattice with space group $P6_322$ (no. 182).

Referring more specifically to the drawings, for illustrative purposes, systems and methods for electrical switching in magnetically intercalated transition metal dichalcogenide based devices are generally shown. Several embodiments of the technology are described generally in FIG. 1 to FIG. 10B to illustrate the characteristics and functionality of the devices, systems, materials and methods. It will be appreciated that the methods may vary as to the specific steps and sequence and the systems and apparatus may vary as to structural details without departing from the basic concepts as disclosed herein. The method steps are merely exemplary of the order that these steps may occur. The steps may occur in any order that is desired, such that it still performs the goals of the claimed technology.

Antiferromagnetic (AFM) memory devices that are based on a class of magnetically intercalated transition metal dichalcogenides (TMDs) are used to generally illustrate the materials and methods and resulting device characteristics. A basic 8-terminal device configuration fabricated from single crystals of $Fe_{1/3}NbS_2$ is used to generally illustrate the methods and resulting device performance characteristics. Although electronically accessible, non-volatile, antiferromagnetic memory storage devices are demonstrated with $Fe_{1/3}NbS_2$ to illustrate the technology, this compound is part of a larger class of magnetically intercalated transition metal dichalcogenide materials that can be used as active materials for a variety of switchable antiferromagnetic memory storage devices.

This class of magnetic compounds is in the form $A_xMC_2$, where A is a magnetic transition metal of stoichiometry x, where x is the stoichiometry of the transition metal intercalant ranging between 0 and 1, M is a transition metal of stoichiometry 1, and C is a chalcogen of stoichiometry 2.

In one embodiment, the magnetic transition metal (A) may also be two or three different magnetic metal intercalants that are co-intercalated at the same total stoichiometry as with the single intercalant metals (i.e. between 0-1). In other embodiments, each of the co-intercalated metals have a stoichiometry in the range of approximately 0.05 to approximately 0.33. In some embodiments, the co-intercalated metals (A) of the material are present in equal parts. In other embodiments, the one or more intercalating metals are present in the material in unequal parts.

Preferred magnetic transition metals (A) include one or more metals of iron (Fe), nickel (Ni), chromium (Cr), cobalt (Co), manganese (Mn) and vanadium (V).

In one preferred embodiment, the stoichiometry of (A) is in the range of approximately 0.30 to approximately 0.36. In another embodiment, the stoichiometry of A is in the range of approximately 0.32 to approximately 0.34. In a particularly preferred embodiment, the stoichiometry of (A) is approximately 0.31.

Preferred transition metals (M) in the $A_xMC_2$ material include niobium (Nb), molybdenum (Mo), tantalum (Ta) and tungsten (W).

Preferred chalcogens (C) in the $A_xMC_2$ material include sulfur (S), selenium (Se), and tellurium (Te).

The antiferromagnetic subset of these compounds is expected to exhibit similar switching characteristics to $Fe_{1/3}NbS_2$ below their antiferromagnetic transition temperatures. Examples of other antiferromagnetic intercalated TMDs with elevated transition temperatures in this family include $Ni_xNbS_2$ and $Cr_xNbS_2$. Specifically, this family of compounds are expected to switch with similar current densities, speeds, and read-out signal. However, the antiferromagnetic transition temperatures may vary between compounds. As a result, other compounds in this class can have transition temperatures at room temperature or higher and should exhibit switching behavior at room temperature. Regardless of the transition temperature, all the described materials have the same basic principal of operation as $Fe_{1/3}NbS_2$ with current pulses applied along orthogonal bars of a cross-shaped devices to write information into the device, and resistance measurements along those same bars to read information out of the device. Other compounds in the magnetically intercalated, antiferromagnetic TMD class of materials would therefore also be able to operate as non-volatile, electronically accessible antiferromagnetic memory storage devices at room temperature (and higher).

Turning now to FIG. 1, the general structure 10 of the class of a magnetically intercalated transition metal dichalcogenide $A_xMC_2$ materials is shown schematically. The structure is illustrated in FIG. 1 with an $Fe_{1/3}NbS_2$ embodiment and not drawn to scale. In this illustration, the $Fe_{1/3}NbS_2$ structure 10 has multiple planes 12 of crystalline niobium (Nb) atoms 14 and sulphur (S) atoms 16. Iron atoms 18 are intercalated in a periodic lattice between planes of the 2H phase of $NbS_2$. Although atoms of a single type of magnetic transition metal intercalant 18 are shown in FIG. 1, two or more types of metal intercalants can be used. Single crystals of the magnetically intercalated transition metal dichalcogenide (e.g. $Fe_{1/3}NbS_2$) may be grown via vapor transport and fabricated into devices using focused ion beam (FIB) techniques, for example.

Figure 2:
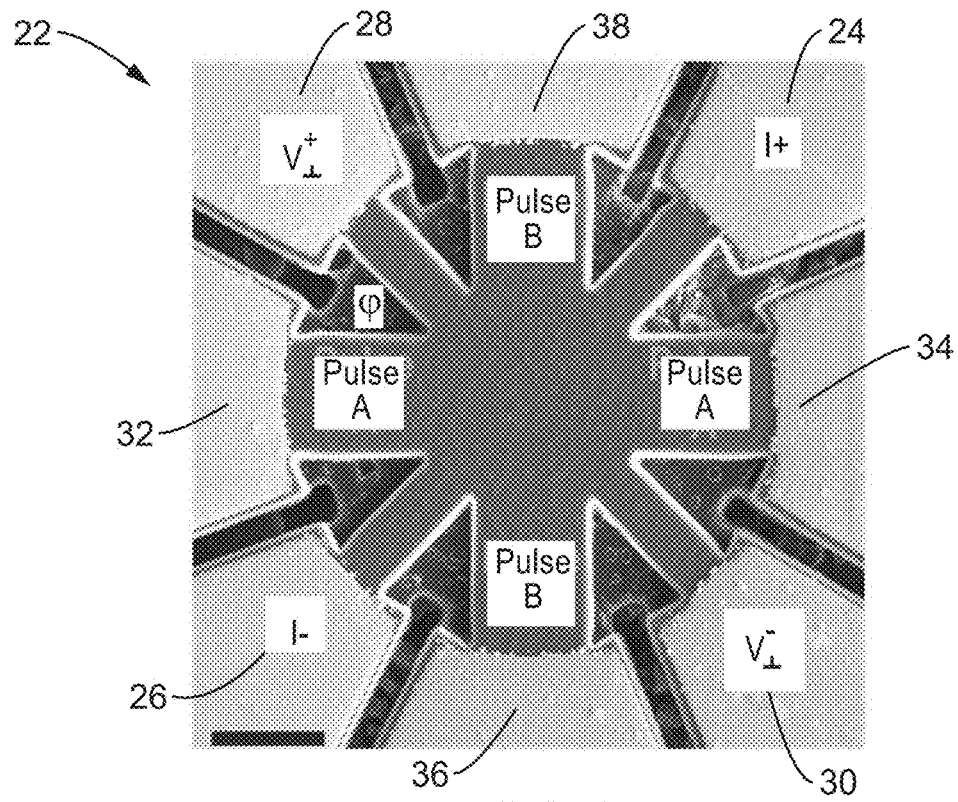
FIG. 2 is a basic 8-terminal device configuration fabricated from single crystals according to one embodiment of the technology.

A typical eight-contact switchable anti-ferromagnetic device is shown in FIG. 2. In this embodiment, the device active element 22 has eight separate legs with individual contacts. The legs of the device are paired linearly with opposing legs to form four bars. The legs of the active element of the device may have the same dimensions or may have different dimensions. For example, as shown in FIG. 2, leg 24 and corresponding leg 26 may form a bar with one set of dimensions and leg 28 and corresponding leg 30 may form a bar with the same set of dimensions. Leg 32 and corresponding leg 34 and leg 36 and leg 38 form bars that are crossed and have different dimensions from the two other bars in this embodiment.

The configuration of legs shown in FIG. 2 allows transverse resistance of the sample to be measured by driving an alternating current (AC) across one leg of the device and measuring the resulting voltage across the orthogonal leg using standard lock-in measurement techniques. For example, orthogonal leg 24 or leg 26 read from source leg 28 or leg 30.

The transverse resistance ($R_\perp$) may be measured using the contacts of the bar of leg 24 and leg 26 or leg 28 and leg 30. In one embodiment, a 100 µA ($5.4 \times 10^2$ A/cm$^2$) alternating probe current is applied along one of these bars like ($I^{+/-}$), while the voltage drop is measured along the orthogonal bar of legs 28, 30 ($V^{+/-}$) using standard lock-in techniques. In tandem, direct current (DC) pulses can be applied along two orthogonal directions from the bar formed from leg 32 and leg 34 or the bar of leg 36 and leg 38 along the vertical [100] and horizontal [1$\bar{2}$0] crystallographic directions of FIG. 2 as illustrated in FIG. 2 and FIG. 3.

For example, a current applied for a period of time along the bar of legs 32, 34 will switch the device into a low transverse resistance state. Applying the sample pulse along the orthogonal bar of legs 36, 38, will switch the device into a high transverse resistance state. The device can be repeatedly switched from one resistance state into the other with subsequent application of a current pulse along the two orthogonal directions. Applying additional current pulses along the same axis or changing the sign of the current does not change the resistance state of the sample, indicating that a single pulse saturates the response. Moreover, once placed in the high or low state, the device is stable and the measured transverse resistance does not decay over time.

Figure 3:
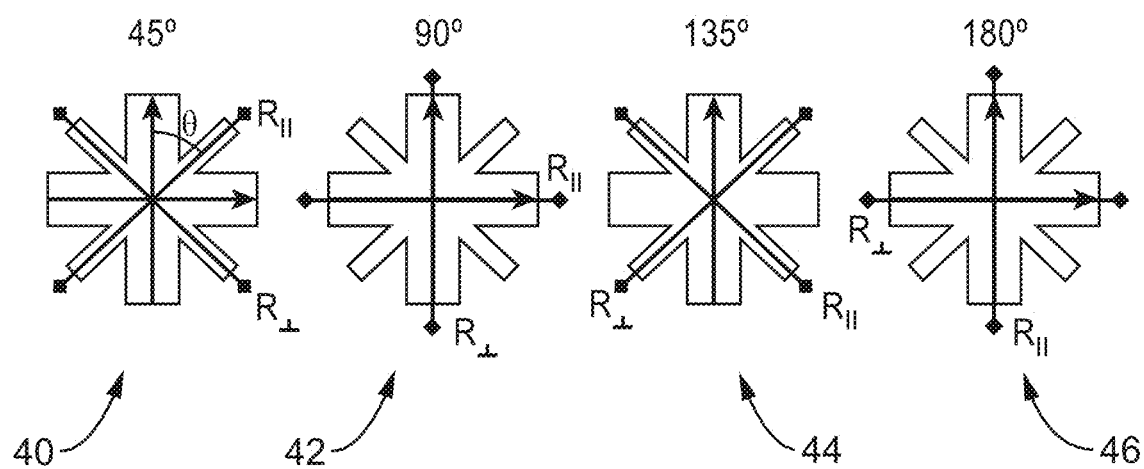
FIG. 3 is series of pulse and read switching geometries of the device of FIG. 2.

As shown in FIG. 3, the application of DC pulses serves to switch the sample between two magnetic states, which can be read out via the transverse resistivity. The switching behavior is dependent on device geometry. The sequence of magnetic rotations shown in FIG. 3 begins with a 45° configuration 40 followed by a 90° configuration 42, a 135° configuration 44 and a 180° configuration 46. In the sequence of FIG. 3, the black arrows denote the fixed directions of the DC pulses, with the horizontal bar pulsed first followed by the vertical bar, preferably repeated at least five times. The $R_\perp$ bar denotes the transverse resistance and the $R_\parallel$ bar denotes the longitudinal resistance and the direction of the alternating probe current. The measurement configuration at 45° is equivalent to that in FIG. 2.

As the angle between the alternating probe current and the direct write pulses is rotated, as illustrated in FIG. 3, the switching signal moves between the transverse ($R_\perp$ bar) and longitudinal ($R_\parallel$ bar) resistance channels, picking up a sign change between 90° and 135°. Rotating the device geometry, as illustrated in the series shown in FIG. 3, can help elucidate the mechanism of the switching behavior. The AC excitation current and the associated four-point resistance measurements ($R_\parallel$ and $R_\perp$) may be rotated between contacts while keeping the DC current pulses fixed. With the AC current 45° from the DC pulses, all of the switching is observed in the transverse channel ($R_\perp$) while almost no signal is observed in the parallel resistance ($R_\parallel$). Rotating the contacts to 90° reverses this condition. The switching appears parallel to the current while the signal in the transverse channel is suppressed. Rotating the contacts further, to 135° and 180°, moves the switching signal back into the perpendicular and parallel channels, respectively, however the sign is now reversed. Accordingly, the application of the same pulse sequence results in a reversed ordering of high and low resistance states.

Figure 4A:
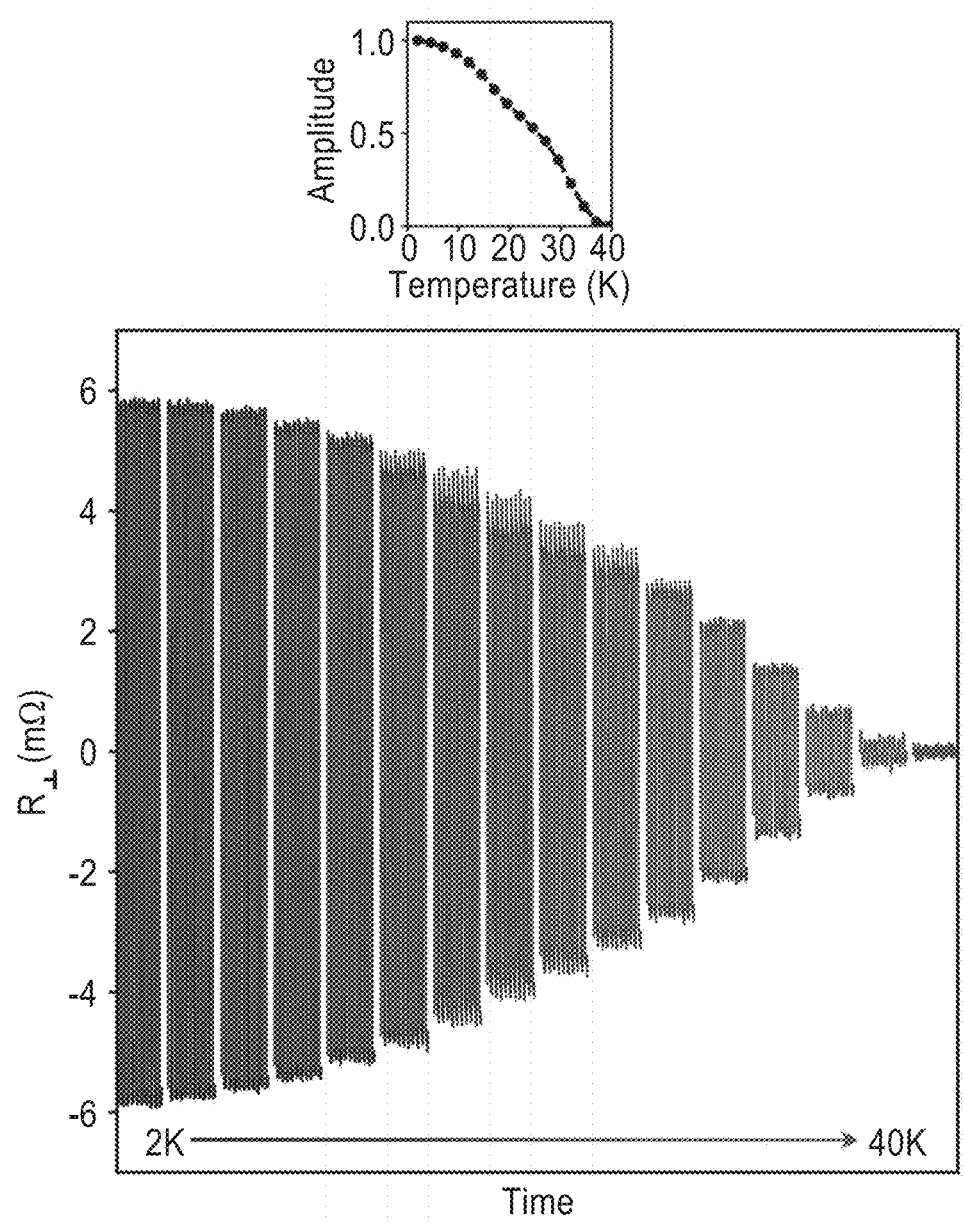
FIG. 4A is a graph depicting switching behavior suppression by temperature. By 40K, the switching amplitude is completely suppressed by as shown in the top graph.

The observed switching behavior is influenced by temperature, magnetic fields, and current density and duration. FIG. 4A shows the temperature dependence of the switching, which perfectly correlates with the transition. As seen in FIG. 4A, the switching behavior is suppressed by temperature. By 40K, the switching amplitude is completely suppressed, as show in the top graph. The temperature-dependent background of the transverse resistance ($R_\perp$) has been subtracted from all curves in FIG. 4A to highlight only the switching component.

Figure 4B:
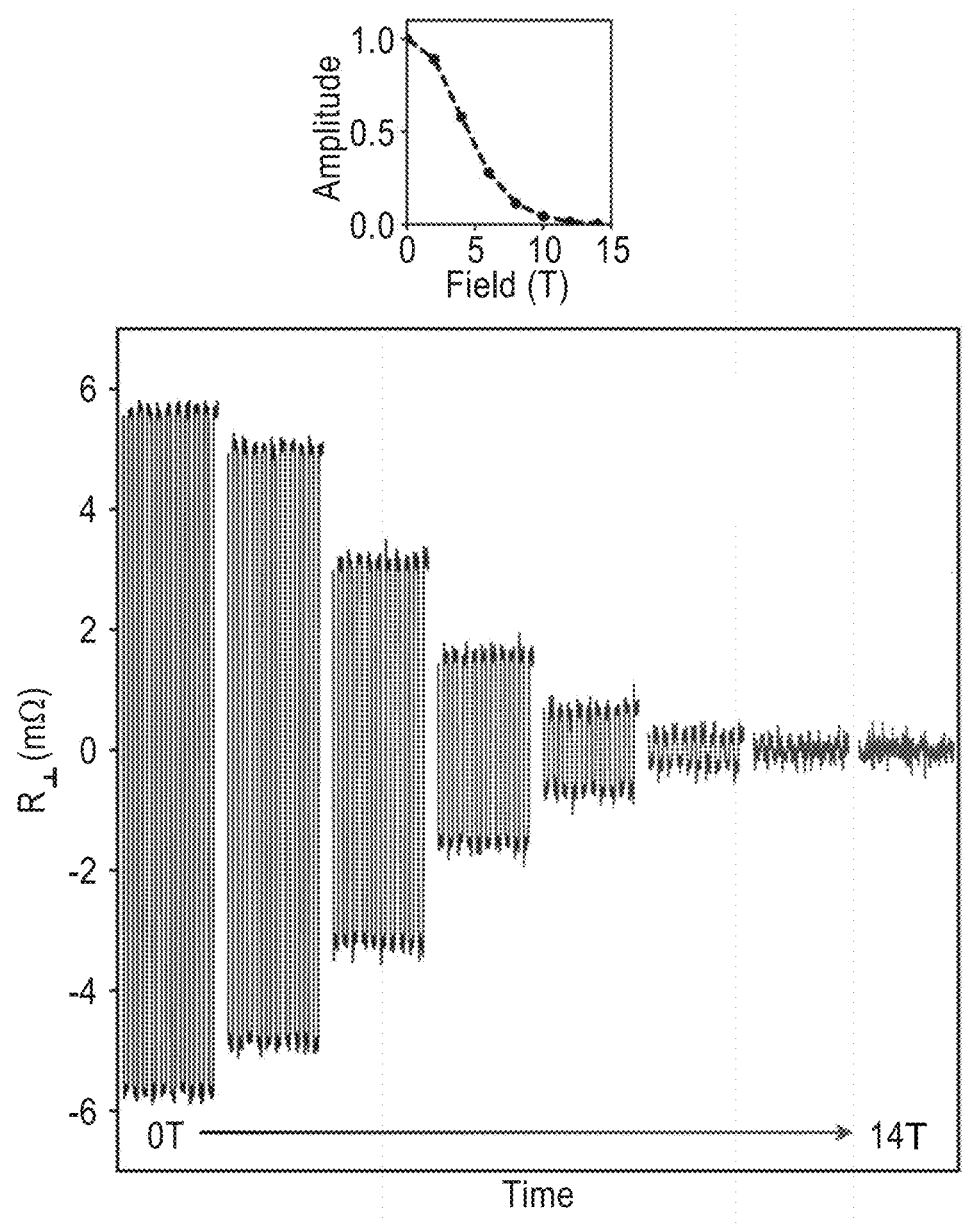
FIG. 4B is a graph depicting suppression of switching behavior at 2K by magnetic fields. Switching behavior can be observed in fields as high as 12T.

The switching behavior of $Fe_{1/3}NbS_2$ appears to originate from the coupling of the charge current to the magnetic order. Application of an out-of-plane magnetic field also suppresses the switching behavior. As seen in FIG. 4B, the switching behavior at 2K is also suppressed by magnetic field strength, although it shows surprising robustness and can be observed at fields as high at 12T. The magnetic field was applied along the crystallographic [001] direction. The field-dependent background of $R_\perp$ has been subtracted in the graph of FIG. 4B to highlight only the switching component. The extracted switching amplitude is shown in the top graph of FIG. 4B. This insensitivity to magnetic fields is a strong indication that the switching stems from an AFM order and makes $Fe_{1/3}NbS_2$ and related compounds suitable candidates for robust, low-temperature memory storage applications.

Figure 5:
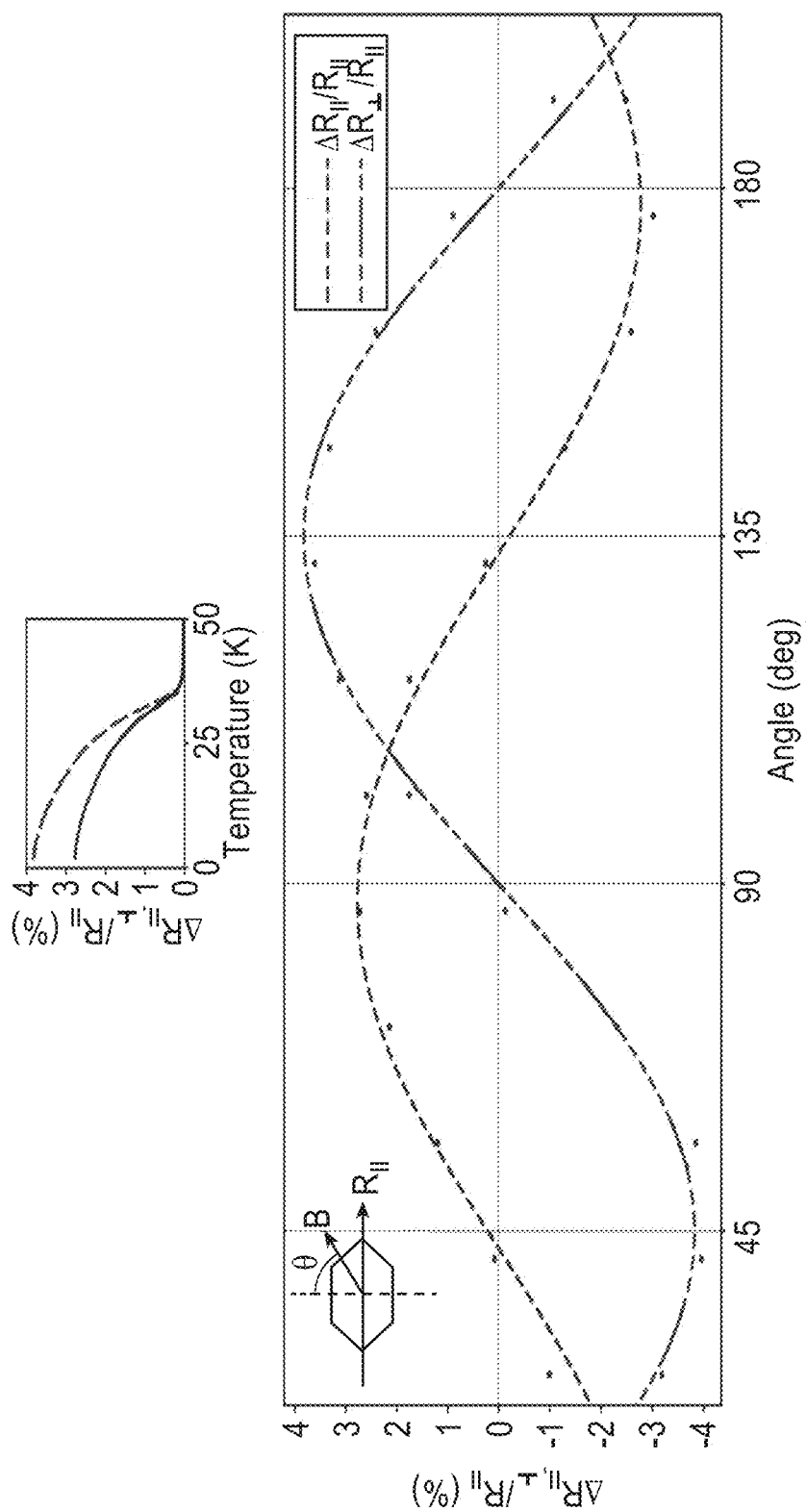
FIG. 5 is a graph depicting zero field AMR. Every 45-degree rotation shifts the signal from one resistance channel into the other.

The zero-field AMR shows a very similar angle dependence to the device geometry as illustrated in FIG. 5. Every 45° rotation shifts the signal from one resistance channel into the other. Moreover, the sign of the AMR switches in the same angular range as the sign change in the switching. As shown in the top graph, the AMR vanishes at approximately 40K, the same temperature at which the switching behavior disappears. A constant background has also been subtracted from both curves for clarity.

The angle dependence of the switching is intimately connected to the anisotropic magnetoresistance (AMR). The AMR was measured by field cooling a bulk crystal in a 9 Tesla in-plane field from above the AFM transition to 2K. The magnetic field was then turned off, and $R_\parallel$ and $R_\perp$ were measured. This process was repeated at several angles, shown in FIG. 3. After background subtraction, $R_\parallel$ and $R_\perp$ show the characteristic sinusoidal AMR behavior offset by 45°. The amplitude of the AMR signal is completely suppressed by 40K, the same temperature at which the switching behavior disappears and close to the AFM transition.

It should be noted that the AMR presented in FIG. 5 is the zero-field AMR. This differs from a conventional AMR measurement in which $R_\parallel$ and $R_\perp$ are measured in the presence of a finite magnetic field. The fact that these quantities are non-zero means that the in-plane field influences the direction of the AFM order, which remains frozen-in even after the field is removed. This is believed to be due to AFM domains where local Néel vectors are oriented along the principal axes of the lattice, but the aggregate Néel vector can be rotated pseudo-continuously by flipping individual domains via the applied field. As a result, the magnetic field can write information into $Fe_{1/3}NbS_2$, which can then be read out via the AMR after cooling, in a similar manner to the current pulses.

It should also be noted that the zero-field AMR of FIG. 5 also has the same angle dependence as the switching amplitude. Where $R_\parallel$ or $R_\perp$ in the AMR is maximized, the switching amplitude is maximized in the same channel. Where the $R_\parallel$ or $R_\perp$ go through zero, the switching behavior is suppressed. Where $R_\parallel$ or $R_\perp$ become negative, the switching order inverts. This implies that the application of a current pulse to the device is similar to an in-plane magnetic field: both "write" a preferred orientation into the AFM state, which can then be electronically "read" via the AMR. In other words, both a current pulse and an applied magnetic field act to rotate the principal axes of the resistivity tensor in the same way. In this manner, the device can be used to store information with electrical write-in and read-out.

There is also a dependence of the switching behavior on the current density and pulse duration of the DC pulses. At large current densities and durations the switching amplitude saturates. At low densities/durations, the switching amplitude is non-monotonic, exhibiting a local maximum. Although the switching is still resolvable, the amplitude is smaller than in the saturated region and the high/low resistance states are not perfectly repeatable.

The pulse duration shows a very similar behavior to the current dependence, with a local maximum followed by saturation of the switching amplitude. As discussed below, this is likely because the pulse does not fully polarize the magnetic texture below a critical threshold. Although not fully saturated, switching can be observed at current densities as low as $2.7 \times 10^4$ A/cm$^2$ and pulse durations as short as 10 µs, for example, both orders of magnitude lower that what has been reported in CuMnAs and Mn$_2$Au.

In addition, a spin glass state has been observed to coexist with the AFM order at low temperature, that is likely to be responsible for the observed residual moment between the field cooled and zero-field cooled curves. Although the interplay between the spin glass state and the AFM order is likely important, it is not believed that the spin glass by itself is responsible for the changes in resistance, but it may act to amplify the rotation of the antiferromagnet. Switching is significant at temperatures where the spin glass dynamics are strongly suppressed and in intercalated samples which do not show any spin glass behavior.

In order to understand the switching behavior, it is useful to treat it as two separate processes: "write-in" in which information is encoded into the AFM state via the current pulses, and "read-out" in which the AFM state is probed by a resistivity measurement. The read-out process is equivalent to the aforementioned AMR measurements. Anisotropic scattering of conduction electrons from localized iron moments changes the measured resistivity depending on the relative orientation of the AFM order and the AC probe current. In this manner, the resistivity tensor is sensitive to the direction of the in-plane AFM order.

In the write-in process, current pulses reorient the AFM order and hence rotate the principal axes of the AMR-derived resistivity tensor. Importantly, the zero-field AMR measurements show that the underlying mechanism must couple an applied magnetic field and electric current to the AFM order in the same way.

In a conventional heterostructure device, a nonzero spin polarization, $\vec{p}$, is achieved by injecting charge carriers through a fixed ferromagnetic layer. In the present example, the inverse spin galvanic effect and the broken inversion symmetry of the lattice lead to a net spin polarization of the charge current. This gives rise to an anti-damping torque that couples to the AFM order and drives the switching. It is thought that Fe$_{1/3}$NbS$_2$ is the only single crystal AFM system in which the anti-damping-like term drives the switching.

The mechanism behind this switching appears to be unique to the Fe$_{1/3}$NbS$_2$ compound and may be responsible for the low current densities required and rapid saturation of the response, making it an excellent candidate for low temperature spintronics applications. There are at least three features of the nature of the switching in Fe$_{1/3+\delta}$NbS$_2$ that distinguishes this system from any known counterpart. First, in order for a spin polarized current to rotate the Néel state of the system with any efficacy, the system needs to be disordered. This distinguishes the Néel rotation due to switching from that caused by applied field in the zAMR, which is not affected by the spin glass state. Second, there is a local exchange interaction that couples the spin glass to the AFM lattice. Third, the freezing of the spin glass has the dual effect of enhancing the current induced rotation of the Néel state, and then pinning it to create a large and stable 'high/low' contrast. In some material and stoichiometry embodiments, however, the switching can be present in the absence of an observable spin glass state.

In order to understand what is special about the coexistence of the spin glass and the AFM, it is notable that in most other examples of switchable AFMs the switching does not saturate with a single pulse, but rather shows a saw-tooth behavior. This is explained by assuming the majority of the response is driven by the motion of AFM domain boundaries, the motion of which will change the average direction of the Néel vector. Domain boundaries generally form near structural defects in the material, and so the switching depends on the ability of these defects to de-pin and move through the AFM lattice. Moreover, increased disorder will tend to make the electron scattering more isotropic, which will usually reduce the 'high/low' contrast of the switching. The present situation appears to be in the opposite limit; not only do defects need to be present, but the associated spin glass needs to be frozen (T<T$_f$) for the switching to become pronounced and stable. This implies that the freezing of the spin glass opens a new channel for the transfer of angular momentum, one that leverages the local stiffness of the spin glass itself.

The connection to stiffness suggests that the collective motion of the spin glass is transferring the spin torque. A related concept to this has been discussed in the context of spin hydrodynamics of insulating correlated spin glasses. The essential idea can be understood by describing the spin glass as a rotation-matrix valued order parameter describing an overall orientation of a volume of mutually disordered but frozen spins. A spin accumulation will generate a collective winding of this volume of spins, which is completely analogous to spin torques across interfaces, with a precession frequency that depends on the ratio of the relevant spin-mixing conductance and the Gilbert damping of the spin glass. In principle, if there is a coexisting AFM, as in the present case, collective motion imparts spin torque on the Néel vector. Although the magnetic disorder and associated local anisotropies mean that spin is not conserved locally, the spin texture is topologically constrained by its spatiotemporal winding characteristics, with the net spin being the generator of the winding. The winding dynamics thus appears as a net non-equilibrium spin, amplifying the spin transfer from the electronic spin accumulation of the current pulse.

This mechanism may also help explain another unusual feature in the switching of Fe$_{1/3+\delta}$NbS$_2$, illustrated in FIG. 6 and FIG. 7, the sign of δ determines which direction the Néel vector is rotated during the current pulse. Dilute compositions (δ<0), where the defects are predominantly vacancies, switch in the opposite direction to excess compositions (δ>0), where defects are likely to be interstitials. Such defects would only weakly affect the structure, and extensive TEM studies appear consistent with this identification, showing high intra-layer structural order even for dilute compositions. Therefore, the following empirical correlation can be discerned:

$$\text{sgn}(A_E) = -\text{sgn}(A_B) \times \text{sgn}(\delta),$$

where $A_E$ ($A_B$) is the difference in resistivity $\Delta R_\perp/R_\parallel$ observed in a switching (zAMR) experiment between vertical and horizontal electric pulses (applied magnetic fields). All compositions studied are consistent with this equation at all temperatures. As noted above, the parameter $A_B$ is sensitive only to the AFM order parameter, indifferent to the presence of the spin glass, whose sign measures the orientation of the Néel vector. The parameter δ of this equation, therefore, plays the role of a $Z_2$ nematic field, whose sign determines the equilibrium orientation of the Néel vector after an electrical pulse, as reflected by the sign of $A_E$. This suggests the local dynamics of the spin glass cause the Néel vector to either be rotated towards or away from the applied current pulse. The mechanism behind this must originate from differences in the microscopic spin texture of the spin glass in dilute and excess compositions; for example there may be differences in FM clustering that exchange-bias the response of the AFM or perhaps the helicity of the spin texture about the defects changes, distorting in orthogonal directions in the presence of an electrically driven spin accumulation. Whatever the magnetic texture dynamics responsible, it is apparent that spin is being imparted by the spin glass, with a direction determined by the microscopic nature of the spin glass.

The coupled response of the AFM and spin glass order parameters is unambiguous and is a significant departure from the usual mechanism driving spin-orbit torque based electrical switching of AFMs. The mechanism shares some commonality with FM/AFM heterostructures that leverage the spin angular momentum of the FM order and in some cases its magnons. In the present case, the collective behavior arises from the correlations between the defect species with its spinful environment.

The collective behavior below $T_f$ opens up a new channel of spin transfer and maximizes the efficacy with which angular momentum is imparted to the AFM by the current pulse, the spin glass can be used as a partner in the switching mechanism. This shows that while this mechanism is an uncommon way to leverage a spin glass to electrically switch an AFM, it need not be unique to $Fe_{1/3+\delta}NbS_2$; correlated spin glasses appear generically in frustrated magnets, opening the field to candidate platforms that are in equal measure of applied and fundamental interest.

It has been demonstrated that current pulses can be used to rotate an in-plane component of the AFM order in $Fe_{1/3}NbS_2$ via an anti-damping-like spin transfer torque, thereby electronically writing information into the AFM state. This information can subsequently be read-out with electronic resistivity measurements via the zero-field AMR, forming an electronically accessible AFM memory device. Moreover, $Fe_{1/3}NbS_2$ is just one of numerous compounds in the class of intercalated transition metal dichalcogenides that demonstrate antiferromagnetic switching that can be adapted for a variety of low temperature spintronics applications.

The technology described herein may be better understood with reference to the accompanying examples, which are intended for purposes of illustration only and should not be construed as in any sense limiting the scope of the technology described herein as defined in the claims appended hereto.

Example 1

To demonstrate the functional characteristics of the intercalated transition metal dichalcogenides, single crystals of $Fe_{1/3}NbS_2$ were grown via vapor transport using iodine as the transport agent and then processed into a device.

The active material was prepared from a polycrystalline precursor powder of stoichiometric amounts of iron, niobium, and sulfur in the ratio x:1:2 (Fe:Nb:S), that was sealed in a quartz ampule. The ampule was heated to 400° C. for 12 hours followed by heating to 900° C. for 48 hours. The resulting powder was then mixed with 2.2 mg/cm³ of iodine and loaded into a horizontal two-zone furnace. The source end was held at 950° C. and the sink end at 800° C. for a period of 7 days. High quality hexagonal crystals with diameters of several millimeters were obtained.

The iron intercalation values were confirmed by inductively coupled plasma optical emission spectroscopy (ICP-OES) using a Perkin Elmer Optima 7000 DV ICP-OES system and energy dispersive X-ray spectroscopy using an Oxford Instruments X-MaxN 50 mm² system. To perform the ICP-OES, the samples were first digested in hot 65% nitric acid, which was subsequently treated with an excess of HF to ensure complete dissolution of niobium, and the solutions were subsequently diluted to appropriate concentrations. Crystal structure was confirmed with both powder and single-crystal x-ray diffraction. Powder X-ray diffraction measurements were performed using a Rigaku Ultima-4 system with a Cu K-α radiation. Low field magnetization measurements were performed using a Quantum Design MPMS-3 system with a maximum applied magnetic field of 7 T. Heat capacity was measured in a Quantum Design DynaCool PPMS system.

FIB device fabrication was performed by mounting single crystals of thicknesses under 10 μm and lateral dimension of few 100 μm onto glass substrates using epoxy. The epoxy was cured at room temperature for at least 24 hours. Then 200 nm of gold was deposited over the sample and substrate. Using the FIB, gold was milled from the active area of the device, leaving a layer covering the glass substrate, epoxy, and edges of the crystal for electrical contacts. The FIB was then used to mill the negative regions of the device and form the pattern shown in FIG. 2 and FIG. 6A. Channels between contacts were also milled, allowing for independent electrical contact to the eight arms of the device. Contact resistances were few ohms.

Electrical pulses were achieved using a Keithley 6221 current source. NMR measurements were performed using the spin-echo technique, in the Condensed Matter NMR lab at NHMFL, using a home-built NMR spectrometer with quadrature detection. The magnetic field was varied between 6 T and 10 T at various temperatures from 4.2 K to 100 K. Bulk single crystals were used for thermodynamic, zAMR and NMR measurements. The switching devices required fabrication of bulk crystals into defined micro-structures using a Focused Ion Beam microscope.

Example 2

Figure 6A:
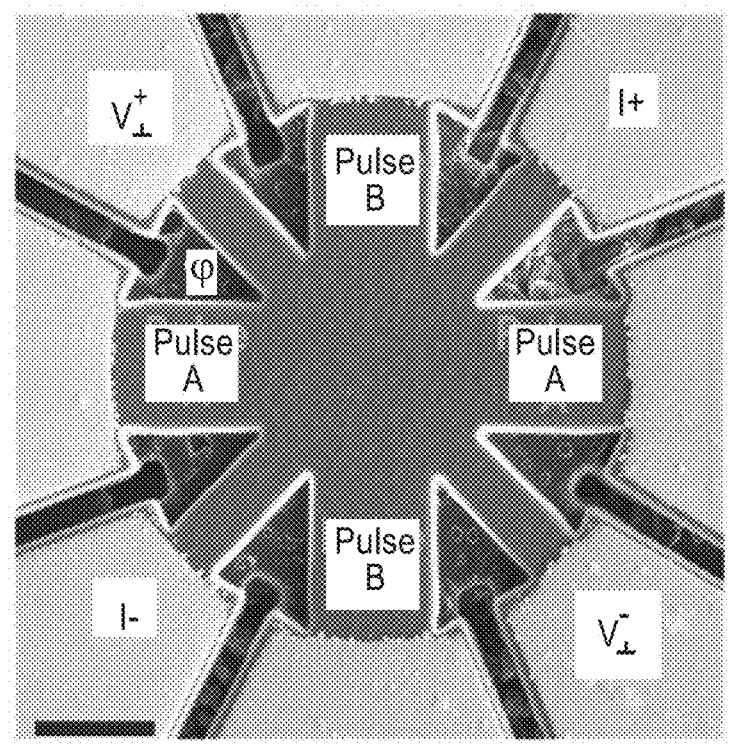
FIG. 6A is a scanning electron microscope image of a standard 8-terminal device focused ion beam device fabricated on a x=0.35 crystal. The device was fabricated in the a-b plane of the $Fe_xNbS_2$ crystal. The AC configuration measurement (read-out) and the DC current pulses (write-in) are marked on the image.

To demonstrate the functionality of the materials, several eight-contact device devices illustrated in FIG. 2 and FIG. 6A were evaluated for resistivity, switching saturation, in field plane dependence and anisotropic magnetoresistance. The longitudinal resistivity was shown to be a function of the temperature of the device. The device showed metallic behavior with a low temperature resistivity of 38 μΩ cm and a subtle kink at the antiferromagnetic (AFM) transition temperature. All resistance measurements were performed in a four-terminal configuration using standard lock-in techniques at an AC frequency of 277 Hz. The devices were measured with a probe current of 100 μA (RMS). The switching amplitude decreased as the temperature increased up to approximately 40K, above which switching was no longer observable.

The switching response of $Fe_{1/3}NbS_2$ appeared to be saturated at the current density of $5.4\times10^4$ A/cm² and pulse duration of 10 ms. The application of additional pulses along the same direction did not change the value of the transverse resistance. The DC pulses were applied in the same geometry as shown in FIG. 3 and FIG. 6, but with five consecutive pulses in each direction. Upon application of the first pulse, the device switched into the low (or high) resistance state. The next four pulses in the same direction, however, did not change the resistance state, implying that the response has saturated. This is in contrast to CuMnAs and Mn$_2$Au materials, for example, where the devices were found to approach a fixed resistance value only after the application of tens of pulses.

The dependence of the switching on an in-plane magnetic field was also observed for two orthogonal field orientations. In contrast to the out-of-plane field, the in-plane field appears to have very little effect on the switching up to 14T. This was the case for both orientations.

Anisotropic magnetoresistance was evaluated as the sample is rotated in a constant 9T magnetic field, also known as the conventional anisotropic magnetoresistance (AMR). The magnetoresistance can be well fit to a sin (2θ) dependence, as expected. In general, the conventional AMR amplitude is almost an order of magnitude lower than the zero field AMR, although the amplitude shows a complicated temperature dependence with a peak 30K. This peak differed from the AFM transition temperature of 42K and is not well understood. It may be related to the onset of spin glass behavior in this system.

The zero field AMR at 2K was evaluated and the amplitude appeared to increase monotonically with field and did not show saturation up to 14T. This is likely due to the formation of AFM domains where the local in-plane Néel order is locked to the principal axes of the lattice. Because of the three allowed orientation of these domains, however, the aggregate Néel vector may point in an arbitrary direction, as set by the magnetic field. This pseudo-continuous rotation of the aggregate Néel vector may be formed from the local contributions of individual, discretely rotatable magnetic domains.

As the field was increased, the domains became increasingly polarized, leading to an increasing AMR response. The quadratic increase at low fields should eventually saturate, however this field threshold appeared to be larger than the 14T that could be applied.

The transverse resistance of the sample was measured by driving a 100 µA ($5.4 \times 10^2$ A/cm$^2$) alternating current (AC) across one leg of the device and measuring the resulting voltage across an orthogonal leg using standard lock-in measurement techniques. In tandem, direct current (DC) pulses were applied along two orthogonal directions (vertical and horizontal).

As illustrated in FIG. 3, the application of DC pulses serves to switch the sample between two magnetic states, which can be read out via the transverse resistivity. A $5.4 \times 10^4$ A/cm$^2$ current was applied for 10 ms along the horizontal bar switched the device into a low transverse resistance state. Applying the sample pulse along the vertical bar switched the device into a high transverse resistance state. The device was repeatably switched from one resistance state into the other with subsequent application of a current pulse along the two orthogonal directions. Applying additional current pulses along the same axis or changing the sign of the current does not change the resistance state of the sample, indicating that a single pulse saturates the response. Moreover, once in the high or low state the device is stable, the measured transverse resistance does not decay over the 30-second intervals shown. Longer stability intervals were also observed.

The switching behavior of Fe$_{1/3}$NbS$_2$ was shown to originate from the coupling of the charge current to the magnetic order. Application of an out-of-plane magnetic field also suppresses the switching behavior, although it can still be observed at fields as high as 12T. This insensitivity to magnetic field is a strong indication that the switching stems from an AFM order and makes Fe$_{1/3}$NbS$_2$ and related compounds suitable candidates for robust, low-temperature memory storage applications.

Rotation of the device geometry, as shown in FIG. 3, confirmed the mechanism of the switching behavior. The AC excitation current and the associated four-point resistance measurements ($R_\parallel$ and $R_\perp$) were rotated between contacts while keeping the DC current pulses fixed. With the AC current 45° from the DC pulses, the configuration 40 of FIG. 3, all the switching was observed in the transverse channel ($R_\perp$) while almost no signal is observed in the parallel resistance ($R_\parallel$). Rotating the contacts to 90° configuration 42 reverses this condition. The switching appeared parallel to the current while the signal in the transverse channel was suppressed. Rotating the contacts further, to 135° and 180°, moved the switching signal back into the perpendicular and parallel channels, respectively, however the sign was now reversed. Namely, application of the same pulse sequence resulted in a reversed ordering of high and low resistance states.

The angle dependence of the switching was also shown to be intimately connected to the anisotropic magnetoresistance (AMR). The AMR was measured by field cooling a bulk crystal in a 9 Tesla in-plane field from above the AFM transition to 2K. The magnetic field was then turned off, and $R_\parallel$ and $R_\perp$ were measured. This process was repeated at several angles, shown in FIG. 3. After background subtraction, $R_\parallel$ and $R_\perp$ showed the characteristic sinusoidal AMR behavior offset by 45°. The amplitude of the AMR signal was completely suppressed by 40K, the same temperature at which the switching behavior disappeared and close to the AFM transition.

Lastly, switching the magnetic field after switching the device appears to preserve the change in the resistance between the high and low states. An A pulse was applied to the device switching it into the low (high) transverse resistance state. An out-of-plane magnetic field was then ramped from 0T to 14T to −14T and back to 0T. Although the absolute value of the transverse resistance showed hysteretic behavior and did not return to the same resistance value, as would be expected from the spin glass background, the difference between the two curves remained essentially unchanged. This implied that although the field changed the magnetization state of the spin glass, it did not change the magnetization state of the AFM order which had been initially established through application of the A or B current pulse shown in FIG. 2. This is further evidence that the AFM order, not the spin glass, is responsible for driving the switching behavior. In addition, it was observed that the magnetic field did not erase the information stored in the AFM order. However, the AFM order cannot be switched at high fields by the application of subsequent current pulses. The magnetic field acts to "freeze" the AFM state.

Example 3

Figure 6B:
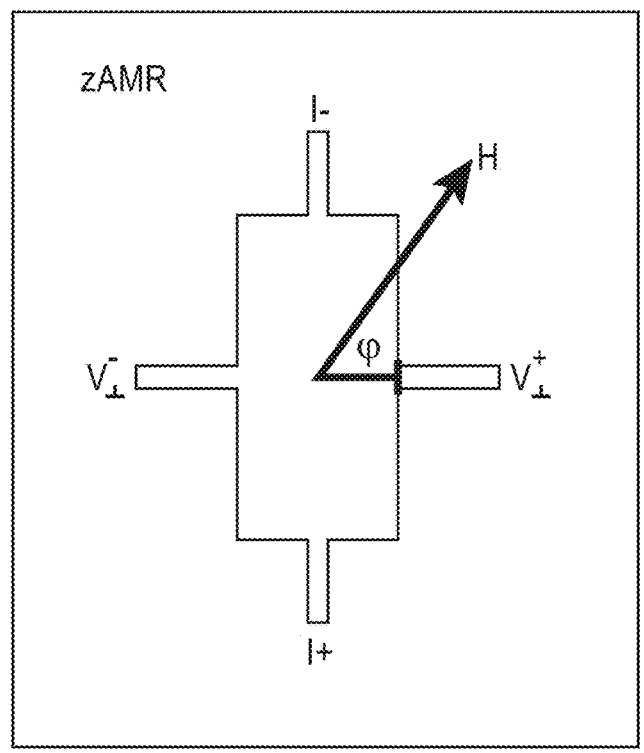
FIG. 6B is a schematic diagram of the device of FIG. 6A with the typical AC contact configuration measured to probe the zAMR effect.

The electrical switching and zAMR effects were evaluated with the basic 8-terminal device configuration fabricated from single crystals of Fe$_{1/3+\delta}$NbS$_2$ shown in FIG. 6A for with x=0.31 and x=0.35 intercalations. The devices were fabricated in the a-b plane of the Fe$_x$NbS$_2$ crystal. The AC configuration measurement (read-out) and the DC current pulses (write-in) are illustrated in FIG. 6A and FIG. 6B. All switching devices were measured by this configuration (switching 45°). A typical AC contact configuration measured to probe the zAMR effect is shown schematically in FIG. 6B below the device.

Figure 7A:
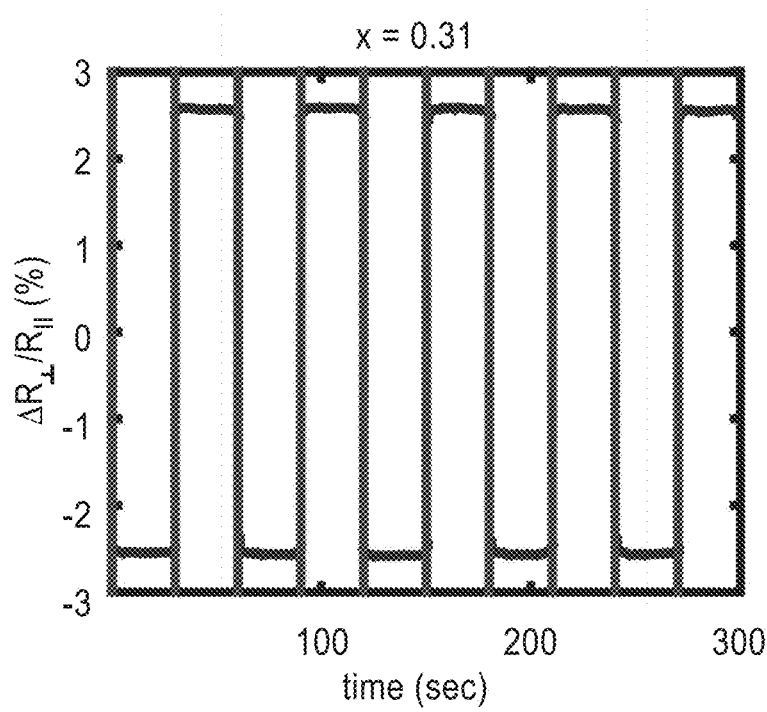
FIG. 7A is a graph of the electrical current switching response measured at 2 K for x=0.31 intercalation.
Figure 7B:
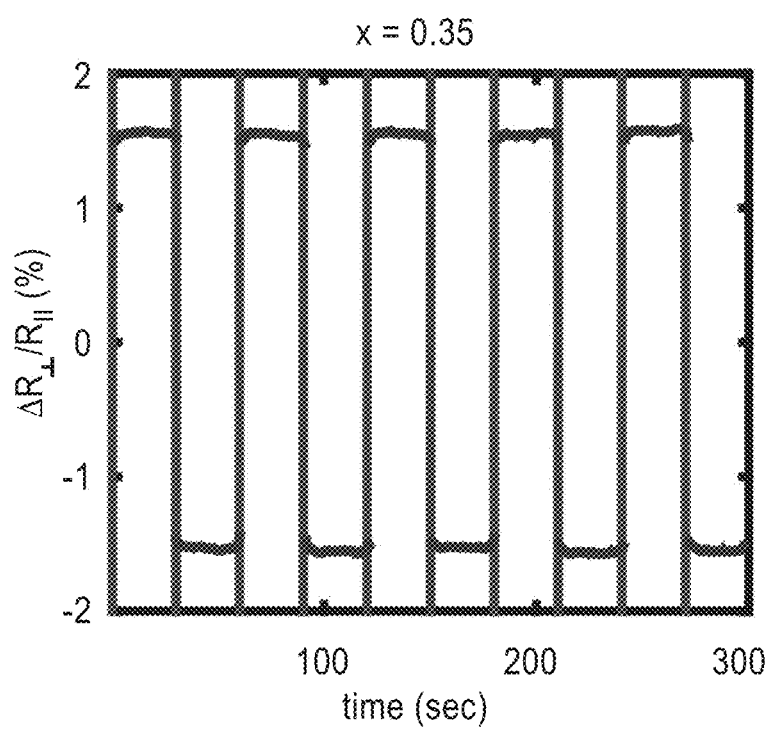
FIG. 7B is a graph of the electrical current switching response measured at 2 K for x=0.35 intercalation. A sequence of five A-B pulses was applied with a 30 seconds delay between pulses. The DC pulse amplitude was set at 54 $kA/cm^2$ (63 $kA/cm^2$) for the x=0.31 and 0.35 intercalations for a duration of 10 ms.

The electrical current switching response measured at 2 K for x=0.31 intercalations is shown in FIG. 7A and the x=0.35 intercalation is shown in FIG. 7B. A sequence of five A-B pulses was applied with a 30 seconds delay between pulses. The DC pulse amplitude was set at 54 kA/cm² (63 kA/cm²) for the x=0.31 and 0.35 intercalations for a duration of 10 ms. The difference between the two switching states were evaluated in the form of background subtracted transverse resistance ($R_\perp \pm R_b$) normalized by the longitudinal resistance ($R_\parallel$). For both intercalations, a stable switching amplitude was demonstrated with an opposite response to the pulse sequence.

Figure 7C:
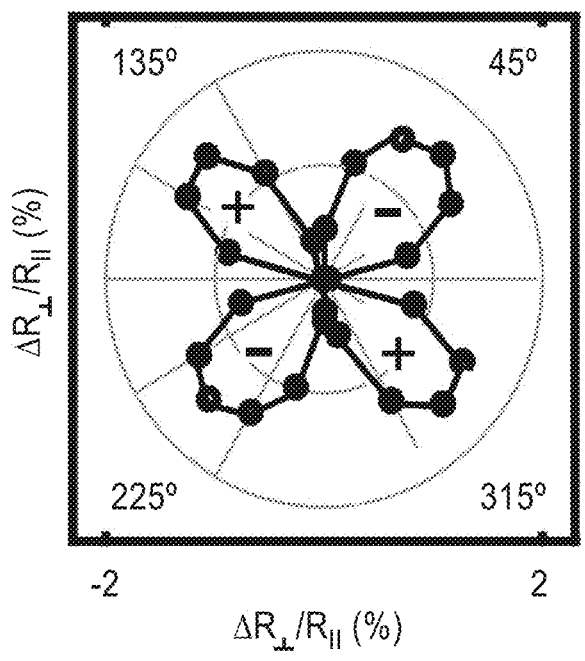
FIG. 7C is an angle dependent polar plot of the zAMR effect measured at 2K for x=0.31 intercalation.
Figure 7D:
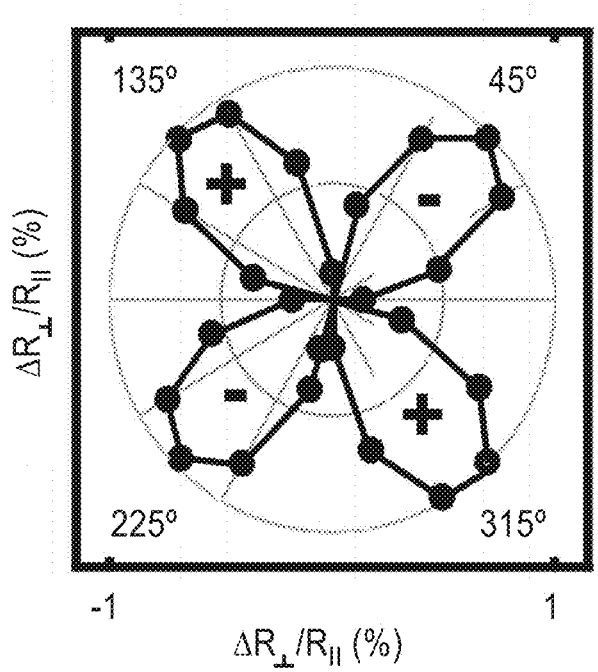
FIG. 7D is an angle dependent polar plot of the zAMR effect measured at 2K for x=0.35 intercalation. The samples were cooled in a magnetic field of 9 T, at various in-plane angles (φ). Subsequently reaching base temperature the magnetic field was turned off and the transverse resistance ($R_\perp$) was measured. A similar zAMR response between the two compositions is observed.

Angle dependent polar plots of the zAMR effect measured at 2 K for x=0.31 is shown in FIG. 7C and the x=0.35 intercalation is shown in FIG. 7D. The samples were cooled in a magnetic field of 9T, at various in-plane angles ($\varphi$). Subsequently reaching base temperature the magnetic field was turned off and the transverse resistance ($R_\perp$) was measured. The zAMR was calculated by subtracting an average background and normalizing to the longitudinal resistance ($R_\parallel$) measured simultaneously. In the diagrams of FIG. 7C and FIG. 7D, the positive zAMR response and negative response for x=0.31 and x=0.35 materials show a similar zAMR response between the two compositions.

Successive vertical and horizontal pulses take the system from high to low resistance states just as in other switchable AFMs, but with two notable differences. First, there is single pulse saturation of the signal, independent of the current density used, with no detectable relaxation to some intermediate resistance. Second, the pulse widths and current densities used are orders of magnitude lower than shown in other systems, typically ~$10^6$ A/cm², whereas switching at ~$10^4$ A/cm² is observed with the present system. In addition, the electrical switching has a different phase for x=0.31 than for x=0.35. This appears to be due to the Néel vector being oriented in perpendicular directions in the dilute and excess iron compounds under the same direction of the current pulse.

Although the Néel order is mostly oriented out of plane, the high and low resistance states are likely associated with the re-orientation of a small in-plane component. This appears to be associated with an order parameter that causes a second transition at a lower temperature $T_N'$, appearing as a larger heat capacity anomaly. In-plane studies of the nuclear magnetic resonance confirmed the presence of an in-plane component to the AFM order. This was also confirmed by measurements of a zero-field anisotropic magnetoresistance (zAMR) where cooling in an in-plane field permanently re-orients the in-plane Néel vector. The zAMR consistently onsets at $T_N'$, consonant with the association of this transition with the in-plane canting of the moments. The zAMR in principle reflects the same conductivity as the 'high/low' states of switching: a convolution of the average orientation of the in-plane Néel vector and the degree of anisotropy in the domain conductivity.

Thermodynamic characterization of $Fe_xNbS_2$ for the x=0.31, 0.34 and 0.35 materials were also performed. Heat capacity versus temperature curves for all intercalation values measured without an applied magnetic field were obtained. The vanishing heat capacity anomalies away from x=⅓ were correlated with the entrance of a glassy state. 1000 Oe magnetization versus temperature curves for each intercalation value for both the field cool and zero field cool were also obtained. The magnetic field was applied in the perpendicular direction with respect to the $NbS_2$ layers (c-axis). The divergence of the FC and ZFC curves demonstrated the onset of glassy behavior, i.e. the spin glass freezing temperature ($T_f$). Relaxation of the magnetization for x=0.31, 0.34 and 0.35 intercalation materials at 5 K after a 1 T field was applied for 1 hour. The measurements were taken after the magnetic field was removed.

Figure 8A:
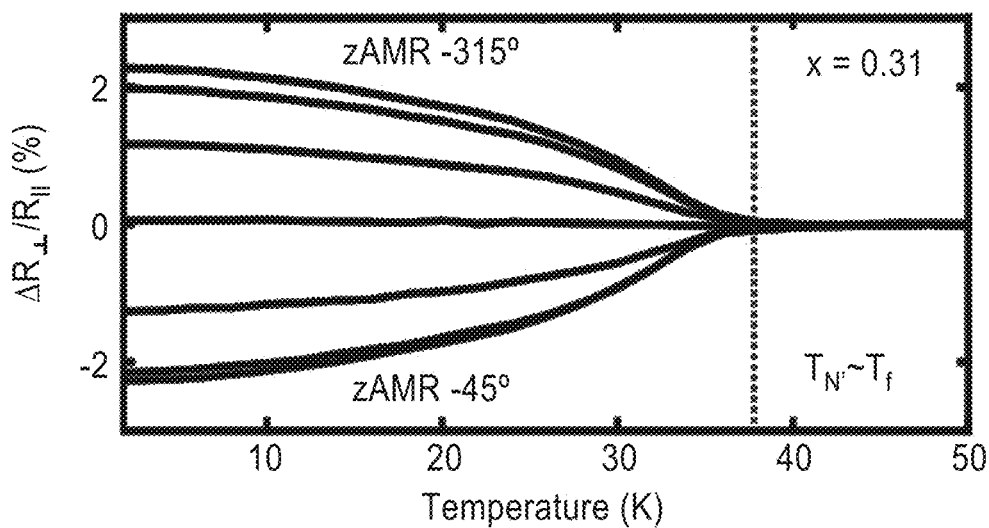
FIG. 8A is a graph of temperature dependent zAMR measurements of x=0.31 intercalation material.
Figure 8B:
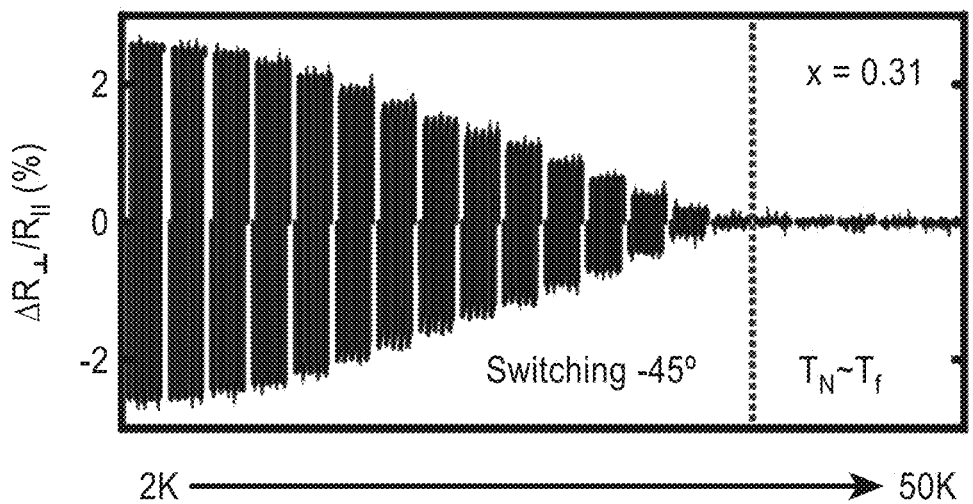
FIG. 8B is a graph of a plot of the electrical current switching response of x=0.31 material of FIG. 8A.
Figure 9A:
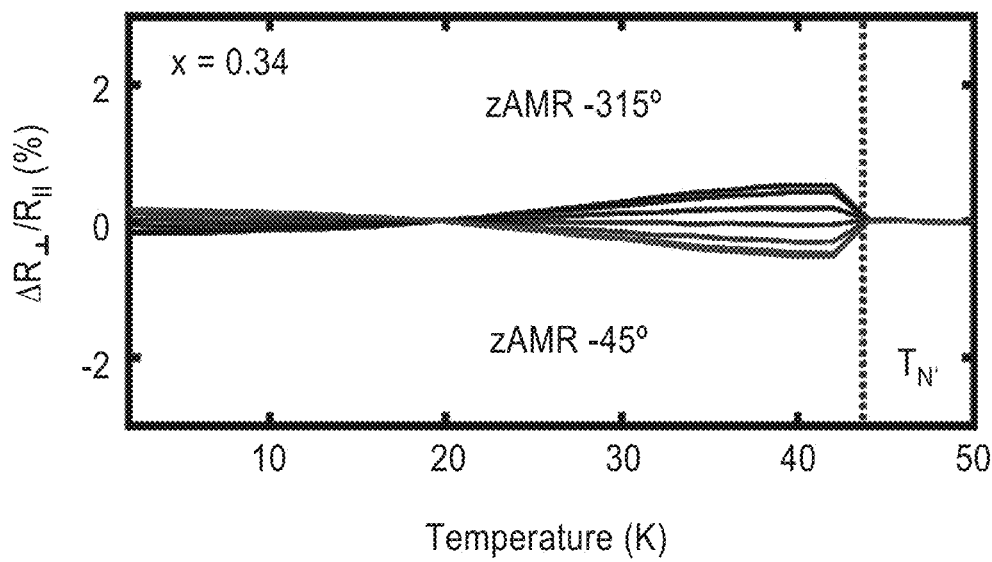
FIG. 9A is a graph of temperature dependent zAMR measurements of x=0.31 intercalation material.
Figure 9B:
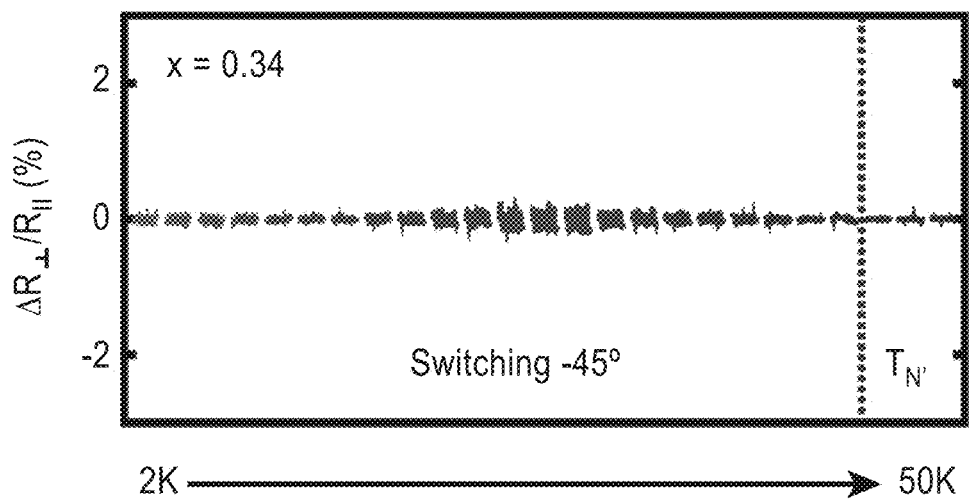
FIG. 9B is a graph of a plot of the electrical current switching response of x=0.34 material of FIG. 9A.
Figure 10A:
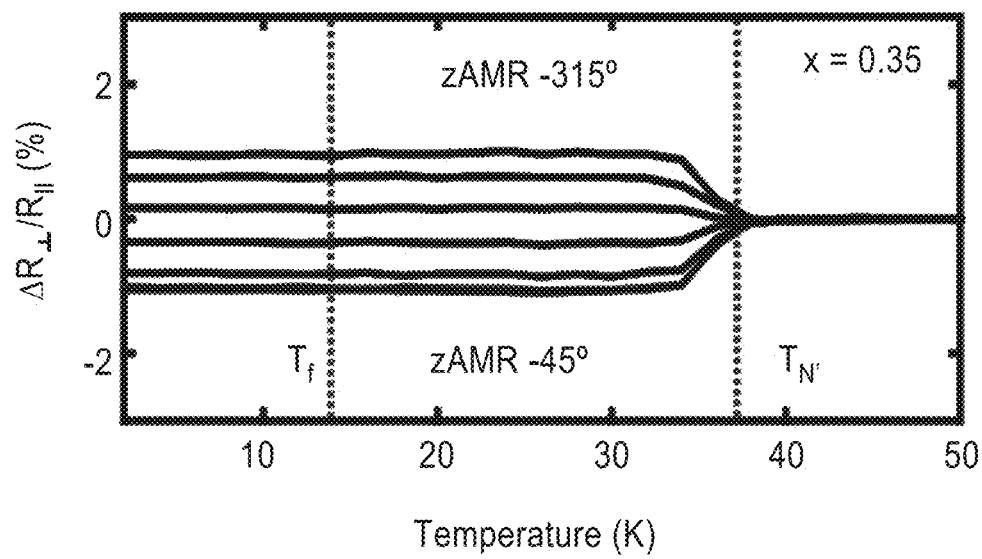
FIG. 10A is a graph of temperature dependent zAMR measurements of x=0.31 intercalation material.
Figure 10B:
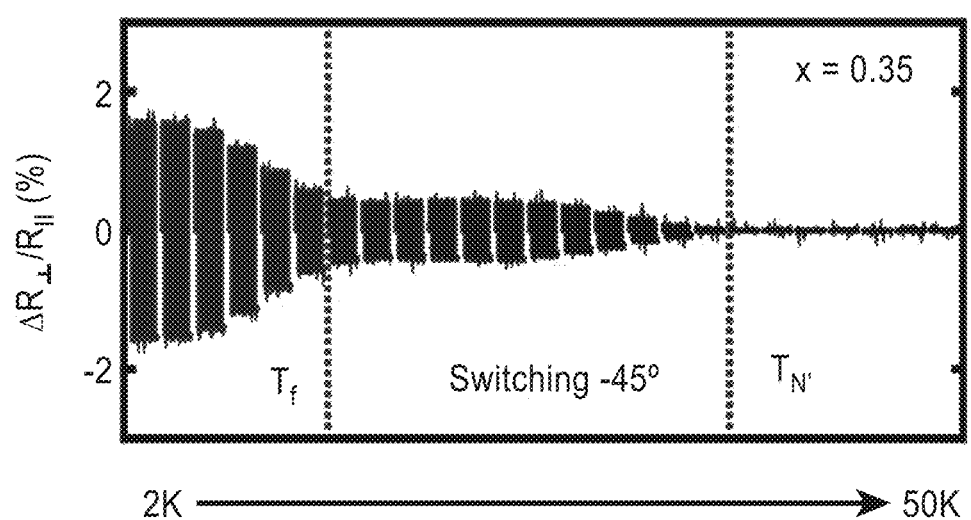
FIG. 10B is a graph of a plot of the electrical current switching response of x=0.35 material of FIG. 10A. For x=0.35 an enhanced switching response appears at the same temperature where the spin glass state starts to freeze ($T_f$).

Electrical switching and zAMR temperature dependencies were also evaluated. The temperature dependent zAMR measurements of x=0.31 is shown in FIG. 8A and FIG. 8B. The zAMR measurements of the x=0.34 material is shown in FIG. 9A and FIG. 9B and the x=0.35 intercalation measurements are plotted in FIG. 10A and FIG. 10B. The FC angle window (zAMR 315° to 45°), for each intercalation in these figures, is presented along the correlated curves. The zAMR onset corresponded to the AFM transition temperature ($T_N'$), with no distinct response to the spin glass freezing temperature ($T_f$).

To achieve switching, current densities of the order of 40-80 kA/cm² and pulse widths of the order of 1 ms to 10 ms were applied. For x=0.35 material shown in FIG. 10B, an enhanced switching response appeared at the same temperature where the spin glass state started to freeze ($T_f$).

The temperature dependent properties of the x=0.31 and x=0.35 compositions to stoichiometric samples near x=⅓ stoichiometry were then compared. The thermodynamic properties are straightforward; the x=0.34 system has the largest and sharpest heat capacity and magnetic anomaly at the Néel transition $T_N'$, broadening significantly at compositions off stoichiometry. The magnetic susceptibility also shows that spin glass dynamics are only present off stoichiometry, manifested as slow relaxation of the magnetization. The sensitivity of the spin glass to its history caused the field-cooled and zero-field cooled curves to separate at a characteristic freezing temperature $T_f$, an effect absent in x=0.34 shown in FIG. 9A and FIG. 9B.

The temperature dependence of the zAMR signal was seen to pass through the freezing of the spin glass with impunity, reflecting only the smooth growth of the AFM order parameter as the temperature is lowered. Because the spin glass is invisible to the zAMR, it provides a reference point for the AFM response, untethered to the spin glass.

The temperature dependence of the electrical switching of the Néel vector offers a surprising contrast to the thermodynamic response: it is strongly suppressed for compounds near stoichiometry and in all respects enhanced when the spin glass is present. The interplay of spin glass and AFM order was especially pronounced in the x=0.35 composition.

Even though the Néel canting transition occurred at $T_N'$~37K, there was observed a large enhancement of the switching at ~15K. There is no (re)ordering phase transition in this range, but it is exactly the temperature where the spin glass freezes, $T_f$. At x=0.31, $T_f$ and $T_N'$ coincide, so that the switching simply follows the growth of the AFM order parameter.

Additionally, the switching of stoichiometric compositions was not only significantly smaller than in the diluted or excess case, but also significantly less stable. An enlargement at low temperatures was observed in the signal for the x=0.34 intercalation that varied from pulse to pulse by up to 20%. In comparison, the intercalation materials where the spin glass was present the signal was stable within 0.5%. The coexistence of the spin glass greatly increased the efficacy of the spin current in transferring angular momentum to the system, leading to an enhancement in both amplitude and stability of the switching. The switching of Fe$_{1/3+\delta}$NbS$_2$ therefore depends on the interplay of the responses of two coupled order parameters, the AFM and the spin glass.

To better understand the mechanism of this interplay, the local environment of magnetic moments with nuclear magnetic resonance (NMR) was evaluated. The iron exchange field was studied via its effect on the $^{93}$Nb lattice (with nuclear spin I=9/2, $\gamma$=10.405 MHz/T). In the paramagnetic state at temperatures T>T$_N'$, the spectra exhibited a broad peak with quadrupolar splitting originating from two Nb unit cell sites. Below T$_N'$ the system splits into a double-peak structure symmetric about the paramagnetic center. This is a signature of AFM order, with the two peaks originating from the two sublattices where the hyperfine field (~1 T) adds to, and subtracts from, the applied magnetic field. Even though the peak structure is broadly the same at all compositions (reflecting a similar AFM order for all x), on cooling in an out-of-plane field an important difference emerges for compositions that are off-stoichiometry; the peaks become asymmetric in magnitude. This strongly suggests that the spin glass exerts an exchange field on the AFM lattice, causing spin-flips that align with one sublattice. Moreover, since it is always the left-most peak that is enhanced, the exchange coupling J of the spin glass to their AFM neighbors is likely ferromagnetic (FM) (J>0) for both dilute and excess compositions. This provides strong evidence for the exchange coupling between the spin glass and the AFM order parameters.

In summary, the coexistence of spin glass and antiferromagnetic order allows a novel mechanism to facilitate the switching of the antiferromagnet Fe$_{1/3+\delta}$NbS$_2$, that is rooted in the electrically stimulated collective winding of the spin glass. The local texture of the spin glass opens an anisotropic channel of interaction that can be used to rotate the equilibrium orientation of the antiferromagnetic state. The use of spin glass collective dynamics to electrically manipulate antiferromagnetic spin textures has never been applied before, opening the field of antiferromagnetic spintronics to many more material platforms with complex magnetic textures.

From the description herein, it will be appreciated that the present disclosure encompasses multiple embodiments which include, but are not limited to, the following:

1. An antiferromagnetic composition, comprising: (a) a magnetically intercalated transition metal dichalcogenide material of the formula A$_x$MC$_2$ in a 2H crystalline phase; (b) wherein each A is at least one magnetic transition metal intercalant of stoichiometry x ranging from 0 to 1; (c) wherein each M is a transition metal with a stoichiometry 1; and (d) wherein each C is a chalcogen with a stoichiometry of 2.

2. The composition of any preceding or following embodiment, wherein the magnetic transition metal intercalant is selected from the group of metals consisting of iron (Fe), nickel (Ni), chromium (Cr) cobalt (Co), manganese (Mn) and vanadium (V).

3. The composition of any preceding or following embodiment, wherein the magnetic transition metal intercalant is two metals selected from the group of metals consisting of iron (Fe), nickel (Ni), chromium (Cr), cobalt (Co), manganese (Mn) and vanadium (V).

4. The composition of any preceding or following embodiment, wherein stoichiometry of the magnetic transition metal intercalant is in the range of 0.30 to 0.36.

5. The composition of any preceding or following embodiment, wherein stoichiometry of the magnetic transition metal intercalant is in the range of 0.32 to 0.34.

6. The composition of any preceding or following embodiment, wherein stoichiometry of the magnetic transition metal intercalant is about 0.31.

7. The composition of any preceding or following embodiment, wherein stoichiometry of the two magnetic transition metal intercalants is in the range of 0.05 to 0.33.

8. The composition of any preceding or following embodiment, wherein the transition metal (M) is a metal selected from the group of metals consisting of niobium (Nb), molybdenum (Mo), tantalum (Ta) and tungsten (W).

9. The composition of any preceding or following embodiment, wherein the chalcogen (C) is selected from the group consisting of sulfur (S), selenium (Se), and tellurium (Te).

10. An electrically switchable antiferromagnetic device, the device comprising: (a) a device body of a magnetically intercalated transition metal dichalcogenide material of the formula Ai$_x$MC$_2$ in a 2H crystalline phase; (i) wherein each A is at least one magnetic transition metal intercalant of stoichiometry x ranging from 0 to 1; (ii) wherein each M is a transition metal with a stoichiometry 1; and (iii) wherein each C is a chalcogen with a stoichiometry of 2; (b) the body with at least one write-in electrode electrically coupled to a source of current; and (c) the body with at least one read out electrode configured to measure resistance; (d) wherein an antiferromagnetic order of the device body rotates with the application of current to the write in electrode from the current source.

11. The device of any preceding or following embodiment, wherein the magnetic transition metal intercalant is selected from the group of metals consisting of iron (Fe), nickel (Ni), chromium (Cr) cobalt (Co), manganese (Mn) and vanadium (V).

12. The device of any preceding or following embodiment, wherein the magnetic transition metal intercalant is two metals selected from the group of metals consisting of iron (Fe), nickel (Ni), chromium (Cr) cobalt (Co), manganese (Mn) and vanadium (V).

13. The device of any preceding or following embodiment, wherein stoichiometry of the magnetic transition metal intercalant is in the range of 0.30 to 0.36.

14. The device of any preceding or following embodiment, wherein the transition metal (M) is a metal selected from the group of metals consisting of niobium (Nb), molybdenum (Mo), tantalum (Ta) and tungsten (W).

15. The device of any preceding or following embodiment, wherein the chalcogen (C) is selected from the group consisting of sulfur (S), selenium (Se), and tellurium (Te).

16. A method of manipulating antiferromagnetic ordering in an antiferromagnetic material, the method comprising: (a) forming an active element of a magnetically intercalated transition metal dichalcogenide material of the formula Ai$_x$MC$_2$ in a 2H crystalline phase; (i) wherein each A is at least one magnetic transition metal intercalant of stoichiometry x ranging from 0 to 1; (ii) wherein each M is a transition metal with a stoichiometry 1; and (iii) wherein each C is a chalcogen with a stoichiometry of 2; (b) forming a plurality of write-in electrodes in the active element, the electrodes electrically coupled to a source of current; (c) forming a plurality of read-out electrodes in the active element, the electrodes; (d) applying a current pulse to one write-in electrode; and (e) measuring a resistance of at least one read-out electrode to determine a resistance state.

17. The method of any preceding or following embodiment, further comprising: applying a second current pulse to an electrode in an orthogonal orientation to the first current pulse electrode; measuring a resistance of at least one read-out electrode; and assigning a resistance state from the measured resistance after the second current pulse.

18. The method of any preceding or following embodiment, wherein the magnetic transition metal intercalant is selected from the group of metals consisting of iron (Fe), nickel (Ni), chromium (Cr) cobalt (Co), manganese (Mn) and vanadium (V).

19. The method of any preceding or following embodiment, wherein magnetic transition metal intercalant is two metals selected from the group of metals consisting of iron (Fe), nickel (Ni), chromium (Cr) cobalt (Co), manganese (Mn) and vanadium (V).

20. The method of any preceding or following embodiment, wherein the stoichiometry of the magnetic transition metal intercalant is in the range of 0.30 to 0.36.

21. The method of any preceding or following embodiment, wherein the transition metal (M) is a metal selected from the group of metals consisting of niobium (Nb), molybdenum (Mo), tantalum (Ta) and tungsten (W).

22. The method of any preceding or following embodiment, wherein the chalcogen (C) is selected from the group consisting of sulfur (S), selenium (Se), and tellurium (Te).

As used herein, the singular terms "a," "an," and "the" may include plural referents unless the context clearly dictates otherwise. Reference to an object in the singular is not intended to mean "one and only one" unless explicitly so stated, but rather "one or more."

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for."

What is claimed is:

1. An antiferromagnetic composition, comprising:
   (a) a magnetically intercalated transition metal dichalcogenide material of a formula $A_xMC_2$ in a 2H crystalline phase;
   (b) wherein each A is at least one magnetic transition metal intercalant of stoichiometry x ranging from 0 to 1;
   (c) wherein each M is a transition metal with a stoichiometry 1; and
   (d) wherein each C is a chalcogen with a stoichiometry of 2.

2. The composition of claim 1, wherein the magnetic transition metal intercalant is selected from the group of metals consisting of iron (Fe), nickel (Ni), chromium (Cr) cobalt (Co), manganese (Mn) and vanadium (V).

3. The composition of claim 1, wherein the magnetic transition metal intercalant is two metals selected from the group of metals consisting of iron (Fe), nickel (Ni), chromium (Cr), cobalt (Co), manganese (Mn) and vanadium (V).

4. The composition of claim 1, wherein stoichiometry of the magnetic transition metal intercalant is in the range of 0.30 to 0.36.

5. The composition of claim 1, wherein stoichiometry of the magnetic transition metal intercalant is in the range of 0.32 to 0.34.

6. The composition of claim 1, wherein stoichiometry of the magnetic transition metal intercalant is about 0.31.

7. The composition of claim 3, wherein stoichiometry of the two magnetic transition metal intercalants is in the range of 0.05 to 0.33.

8. The composition of claim 1, wherein the transition metal (M) is a metal selected from the group of metals consisting of niobium (Nb), molybdenum (Mo), tantalum (Ta) and tungsten (W).

9. The composition of claim 1, wherein the chalcogen (C) is selected from the group consisting of sulfur (S), selenium (Se), and tellurium (Te).

10. An electrically switchable antiferromagnetic device, the device comprising:
   (a) a device body of a magnetically intercalated transition metal dichalcogenide material of a formula $Ai_xMC_2$ in a 2H crystalline phase;
      wherein each A is at least one magnetic transition metal intercalant of stoichiometry x ranging from 0 to 1;
      (ii) wherein each M is a transition metal with a stoichiometry 1; and
      (iii) wherein each C is a chalcogen with a stoichiometry of 2;
   (b) said body with at least one write-in electrode electrically coupled to a source of current; and (c) said body with at least one read out electrode configured to measure resistance;

(d) wherein an antiferromagnetic order of said device body rotates with the application of current to said write in electrode from said current source.

11. The device of claim 10, wherein the magnetic transition metal intercalant is selected from the group of metals consisting of iron (Fe), nickel (Ni), chromium (Cr) cobalt (Co), manganese (Mn) and vanadium (V).

12. The device of claim 10, wherein the magnetic transition metal intercalant is two metals selected from the group of metals consisting of iron (Fe), nickel (Ni), chromium (Cr) cobalt (Co), manganese (Mn) and vanadium (V).

13. The device of claim 10, wherein stoichiometry of the magnetic transition metal intercalant is in the range of 0.30 to 0.36.

14. The device of claim 10, wherein the transition metal (M) is a metal selected from the group of metals consisting of niobium (Nb), molybdenum (Mo), tantalum (Ta) and tungsten (W).

15. The device of claim 10, wherein the chalcogen (C) is selected from the group consisting of sulfur (S), selenium (Se), and tellurium (Te).

16. A method of manipulating antiferromagnetic ordering in an antiferromagnetic material, the method comprising:
(a) forming an active element of a magnetically intercalated transition metal dichalcogenide material of a formula $Ai_xMC_2$ in a 2H crystalline phase;
  (i) wherein each A is at least one magnetic transition metal intercalant of stoichiometry x ranging from 0 to 1;
  (ii) wherein each M is a transition metal with a stoichiometry 1; and
  (iii) wherein each C is a chalcogen with a stoichiometry of 2;
(b) forming a plurality of write-in electrodes in said active element, said electrodes electrically coupled to a source of current;
(c) forming a plurality of read-out electrodes in said active element, said electrodes;
(d) applying a current pulse to one write-in electrode; and
(e) measuring a resistance of at least one read-out electrode to determine a resistance state.

17. The method of claim 16, further comprising:
applying a second current pulse to an electrode in an orthogonal orientation to the first current pulse electrode;
measuring a resistance of at least one read-out electrode; and
assigning a resistance state from the measured resistance after the second current pulse.

18. The method of claim 16, wherein the magnetic transition metal intercalant is selected from the group of metals consisting of iron (Fe), nickel (Ni), chromium (Cr) cobalt (Co), manganese (Mn) and vanadium (V).

19. The method of claim 16, wherein said transition metal (M) is a metal selected from the group of metals consisting of niobium (Nb), molybdenum (Mo), tantalum (Ta) and tungsten (W).

20. The method of claim 16, wherein the chalcogen (C) is selected from the group consisting of sulfur (S), selenium (Se), and tellurium (Te).

* * * * *